US007816761B2

(12) United States Patent
Egawa et al.

(10) Patent No.: US 7,816,761 B2
(45) Date of Patent: Oct. 19, 2010

(54) SEMICONDUCTOR DEVICE HAVING FUSE AND PROTECTION CIRCUIT

(75) Inventors: Noboru Egawa, Tokyo (JP); Yasuhiro Fukuda, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 564 days.

(21) Appl. No.: 11/082,922

(22) Filed: Mar. 18, 2005

(65) Prior Publication Data

US 2006/0049466 A1 Mar. 9, 2006

(30) Foreign Application Priority Data

Sep. 6, 2004 (JP) ............................. 2004-258404

(51) Int. Cl.
*H01L 23/62* (2006.01)

(52) U.S. Cl. .................. 257/529; 257/209; 257/360; 257/363; 257/379; 257/528; 257/E23.149; 257/E23.15

(58) Field of Classification Search ............... 257/379, 257/528, 529, 209, E23.149, E23.15, 360, 257/363

See application file for complete search history.

(56) References Cited

U.S. PATENT DOCUMENTS

| 3,641,516 | A | * | 2/1972 | Castrucci et al. | 365/96 |
|---|---|---|---|---|---|
| 4,238,839 | A | * | 12/1980 | Redfern et al. | 365/96 |
| 4,723,155 | A | * | 2/1988 | Uchida | 257/529 |
| 5,360,988 | A | * | 11/1994 | Uda et al. | 257/529 |
| 5,444,650 | A | * | 8/1995 | Abe et al. | 365/96 |
| 5,675,174 | A | * | 10/1997 | Nakajima et al. | 257/529 |
| 5,701,024 | A | * | 12/1997 | Watt | 257/360 |
| 5,949,323 | A | * | 9/1999 | Huggins et al. | 337/401 |
| 6,373,120 | B1 | * | 4/2002 | Oiyama | 257/529 |
| 6,525,397 | B1 | * | 2/2003 | Kalnitsky et al. | 257/529 |
| 2001/0054740 | A1 | * | 12/2001 | Marr | 257/360 |
| 2001/0054920 | A1 | * | 12/2001 | Tsujino | 327/141 |
| 2002/0027248 | A1 | * | 3/2002 | Aipperspach et al. | 257/350 |
| 2004/0159907 | A1 | * | 8/2004 | Kuno et al. | 257/530 |
| 2005/0156275 | A1 | * | 7/2005 | Hsieh | 257/529 |

FOREIGN PATENT DOCUMENTS

| JP | 11-67054 | 3/1999 |
|---|---|---|
| JP | 3526853 | 2/2004 |

* cited by examiner

*Primary Examiner*—Kenneth A Parker
*Assistant Examiner*—Jay C Kim
(74) *Attorney, Agent, or Firm*—Rabin & Berdo, P.C.

(57) ABSTRACT

A semiconductor device having a semiconductor substrate, an insulating layer, a fuse, a diffusion layer and a resistor. The semiconductor substrate has a first conductivity type. The insulating layer is selectively formed on the surface of the semiconductor substrate. The fuse is formed on the insulating layer. The diffusion layer has a second conductivity type. The diffusion layer is formed on the surface of the semiconductor substrate and electrically connected to the fuse. The first resistor is electrically connected to the fuse.

5 Claims, 9 Drawing Sheets

000000# SEMICONDUCTOR DEVICE HAVING FUSE AND PROTECTION CIRCUIT

BACKGROUND OF THE INVENTION

The present invention relates to a semiconductor device, and particularly to a semiconductor device having fuses for modifying electrical failures of the semiconductor device.

It is difficult to find electric failures or detective conditions generated in a manufacturing process of a semiconductor device (LSI) such as a memory during its manufacturing process. They become clear in an electric testing process executed after the manufacturing process. Therefore, the LSI is provided with at least one redundant fuse to modify the electric failures. The electric failures found out in the electric testing process can be modified by cutting and processing (fuse blow) the fuse with laser light.

The redundant fuse is formed, using a polysilicon layer, on a field insulating film formed on the surface of a semiconductor substrate and is covered with an insulating film as shown in, for example, a patent document 1 (Japanese Unexamined Patent Publication No. Hei 11(1999)-67054). Upon cutting of the fuse, it is cut by laser light together with the insulating film. Thus, a cut section of the fuse is exposed to the outside within a fuse aperture or opening during from after the cutting of the fuse to resin encapsulation.

In a scribing process executed during from after the cutting of the fuse to the resin encapsulation, the cut section of the fuse is subjected to charged water. When ESD (Electro Static Discharge) occurs in this state, there is a possibility that an electrical charge will pass from the charged water to the fuse cut section and a gate electrode of an internal transistor to thereby cause breakdown of a gate insulating film of the internal transistor. There is also a possibility that even by an electrical charge charged on a film with a chip mounted thereon, it will be discharged from the fuse cut section to the gate electrode of the internal transistor, thereby causing the breakdown of the gate insulating film.

A protection circuit that protects an internal circuit of a semiconductor device has been described in, for example, a patent document 2 (Japanese Patent Application No. 3526853). This internal circuit is connected to a ground potential terminal (high potential side) and a low voltage source terminal (low potential side) and operated at a negative potential. The protection circuit comprises a first diode connected between a ground voltage source terminal and an input terminal and operated in the backward direction where a negative polarity surge has occurred in the input terminal, a second diode connected between the input terminal and the low potential source terminal and operated in the forward direction where the negative polarity surge has occurred in the input terminal, an NMOS transistor connected between a substrate potential terminal and the low voltage source terminal, and first and second capacitors which divide the difference in potential between the substrate potential terminal and the low voltage source terminal and applies a source-to-gate voltage to the NMOS transistor. The respective capacitances of the first and second capacitors are selected in such a manner that the source-to-gate voltage of the NMOS transistor does not cause turning-on thereof over its threshold value in the normal case free of the electrostatic surge. Since a backward electrostatic surge current flows in the first diode where the negative polarity surge is intruded into the input terminal, a response time is taken and the electrostatic surge responds in the forward direction of the second diode, so that the electrostatic surge current flows from the second diode to the input terminal. The difference in potential between the substrate potential terminal and the low voltage source terminal becomes, approximately identical to the voltage of the electrostatic surge. Thus, the gate-to-source voltage of the NMOS transistor, which is divided by the first and second capacitors, exceeds the threshold value so that the NMOS transistor is turned ON. Therefore, the electrostatic surge current flows through the substrate potential terminal, the NMOS transistor and the second diode so that the internal circuit is protected from the electrostatic surge.

As described above, the redundant fuse of the semiconductor device is cut by laser and thereafter its cut section is exposed to the outside up to the resin encapsulation. Therefore, there is a fear that in the scribing process or the like, the gate insulating film of each transistor in the internal circuit will be broken due to the electrical charge intruded from the cut section. Although, however, measures against the ESD surge intruded from the input terminal such as described in the patent document 2 have heretofore been taken, any measures are not taken against the ESD surge at the cut section of the redundant fuse.

SUMMARY OF THE INVENTION

The present invention is directed to a semiconductor device having a fuse and a protection circuit for the fuse. According to the aspect of the present invention, a semiconductor device having a semiconductor substrate, an insulating layer, a fuse, a diffusion layer and a resistor. The semiconductor substrate has a first conductivity type. The insulating layer is selectively formed on the surface of the semiconductor substrate. The fuse is formed on the insulating layer. The diffusion layer has a second conductivity type. The diffusion layer is formed on the surface of the semiconductor substrate and electrically connected to the fuse. The first resistor is electrically connected to the fuse.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings.

First Preferred Embodiment

[Electric Circuit]

Figure 1:
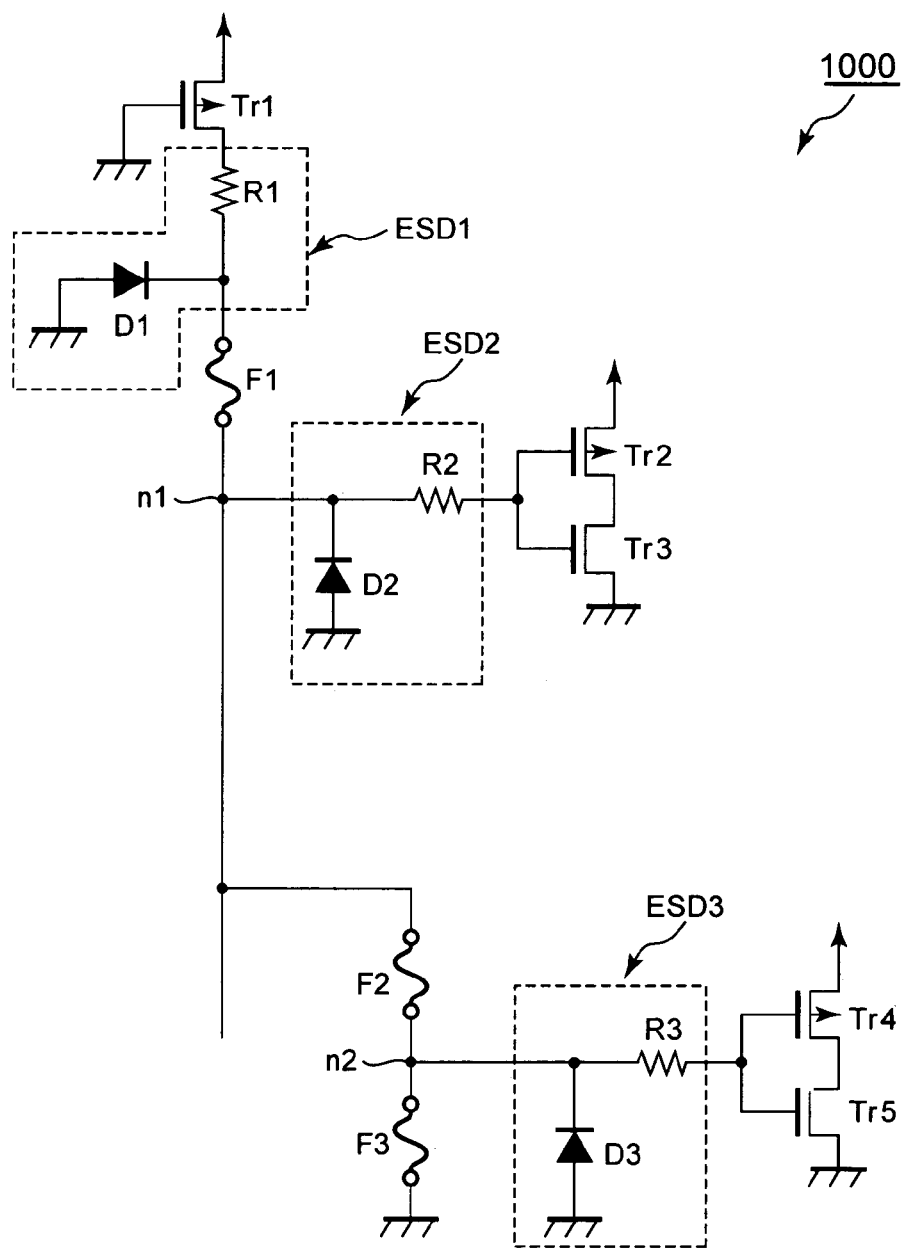
FIG. 1 is an electric circuit diagram showing ESD protection circuits provided in the neighborhood of redundant fuses of a semiconductor device according to a first embodiment.

FIG. 1 is an electric circuit diagram showing ESD protection circuits provided in the neighborhood of redundant fuses of a semiconductor device according to a first embodiment.

Figure 2:
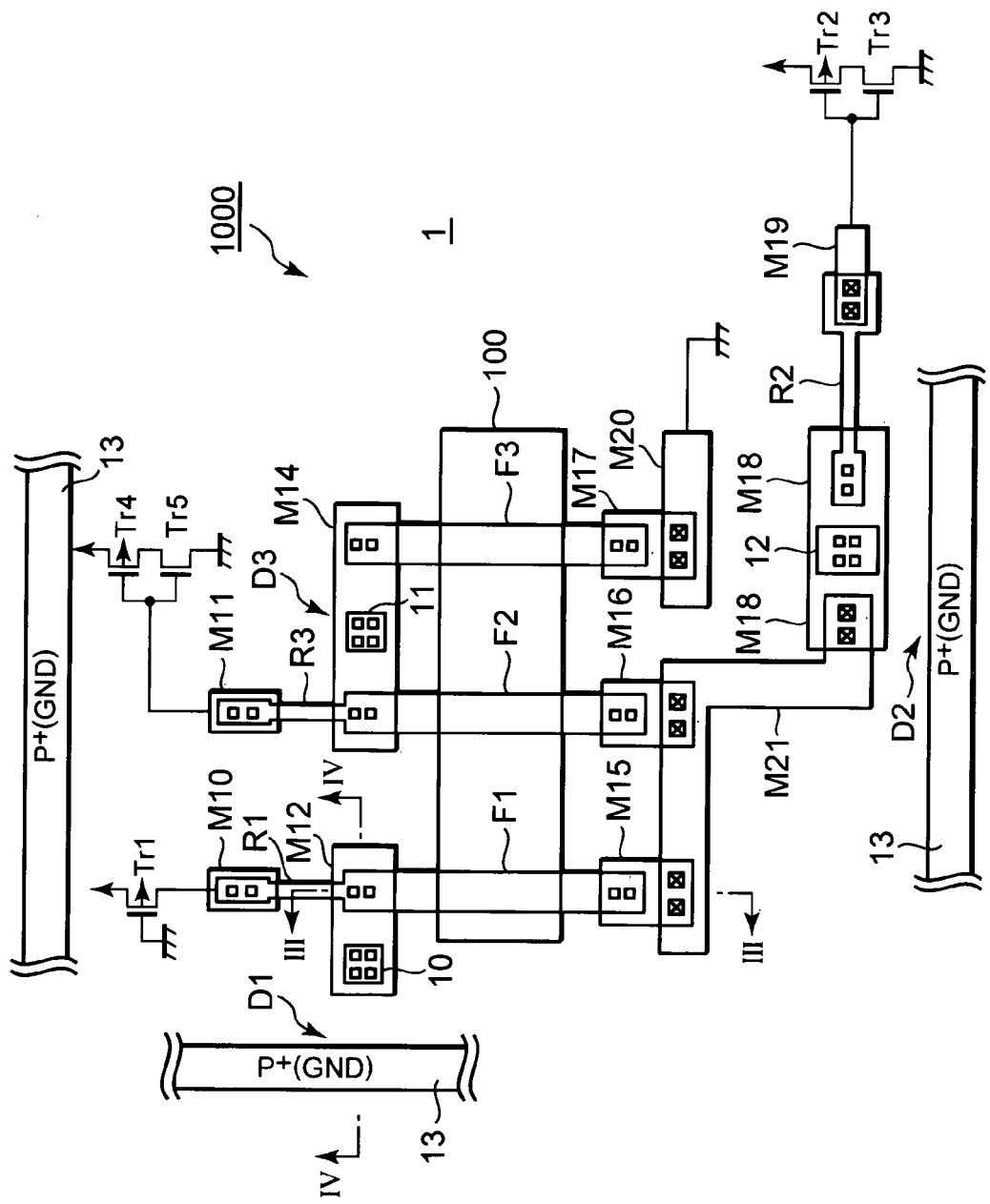
FIG. 2 is a plan view showing the ESD protection circuits according to the first embodiment.

As shown in FIGS. 1 and 2, the semiconductor device 1000 is provided with fuses F1 through F3, ESD protection circuits ESD1 through ESD3 and an internal circuit including transistors Tr1 through Tr5.

The fuses F1 through F3 are of redundant fuses for modifying electric failures of the semiconductor device 1000. One end of the fuse F1 is connected to its corresponding drain terminal of the P-type MOS transistor Tr1 through the ESD1. A source terminal of the transistor Tr1 is connected to a power supply and a gate terminal thereof is connected to a substrate potential. The transistor Tr1 is always made conductive in a state in which the source terminal thereof is being supplied with power, to thereby supply a voltage to the fuse F1 through a resistor R1. On the other hand, the other end of the fuse F1 is connected to gate terminals of the transistors Tr2 and Tr3 of the internal circuit via a node n1 and the ESD2 and connected to one end of the fuse F2 through the node n1. The other end of the fuse F2 is connected to one end of the fuse F3 at a node n2, whereas the other end of the fuse F3 is grounded to the substrate potential. The fuses F2 and F3 are connected to their corresponding gate terminals of the transistors Tr4 and Tr5 of the internal circuit through the node n2 and the ESD3.

The ESD1 has a diode D1 and the resistor R1. A cathode terminal of the diode D1 is connected to the fuse F1, whereas its anode terminal is connected to the substrate potential. The resistor R1 is connected to the fuse F1 and the source terminal of the transistor Tr1. The ESD2 is provided with a diode D2 and a resistor R2. A cathode terminal of the diode D2 is connected to the fuses F1 and F2 via the node n1, whereas an anode terminal thereof is connected to the substrate potential. The resistor R2 is connected to the gate terminals of the transistors Tr2 and Tr3 and the node n1. The ESD3 includes a diode D3 and a resistor R3. A cathode terminal of the diode D3 is connected to the fuses F2 and F3 via the node n2, whereas an anode terminal thereof is connected to the substrate potential. The resistor R3 is connected to the gate terminals of the transistors Tr4 and Tr5 and the node n2.

When an ESD surge is generated at a cut section of the fuse F1, the ESD1 discharges an electrical charge to the substrate potential via the diode D1 and prevents the electrical charge from being transferred to the drain terminal of the transistor Tr1 through the resistor R1, thereby preventing a gate insulating film for the transistor Tr1 from breaking down due to the ESD surge. When an ESD surge occurs in the cut section of the fuse F1 or F2, the ESD2 discharges an electrical charge to the substrate potential via the diode D2 and allows the resistor R2 to prevent the electrical charge from being transferred to the gate terminals of the transistors Tr2 and Tr3, thereby preventing a gate insulating film for the transistors Tr2 and Tr3 from breaking down due to the ESD surge. When an ESD surge occurs in the cut section of the fuse F2 or F3, the ESD3 discharges an electrical charge to the substrate potential via the diode D3 and causes the resistor R3 to prevent the electrical charge from being transferred to the gate terminals of the transistors Tr4 and Tr5, thereby preventing a gate insulating film for the transistors Tr4 and Tr5 from breaking down due to the ESD surge.

[Structure]

The structures of the ESD protection circuits employed in the redundant fuses of the semiconductor device 1000 will next be explained with reference to FIGS. 2 through 5.

Figure 3:
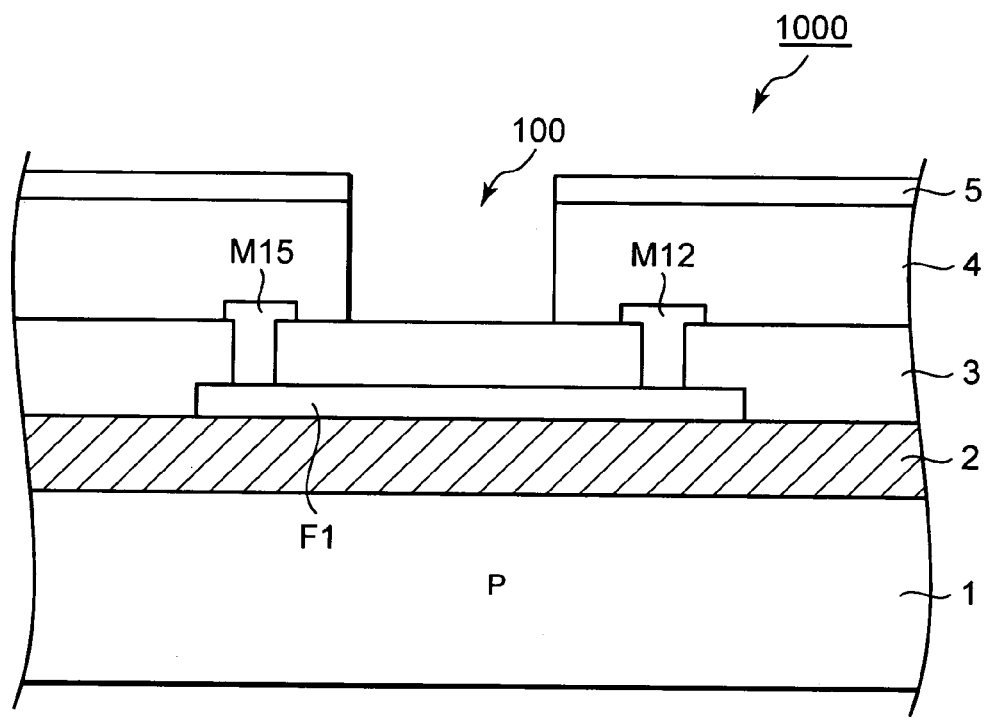
FIG. 3 is a cross-sectional view taken along line III-III of FIG. 2.
Figure 4:
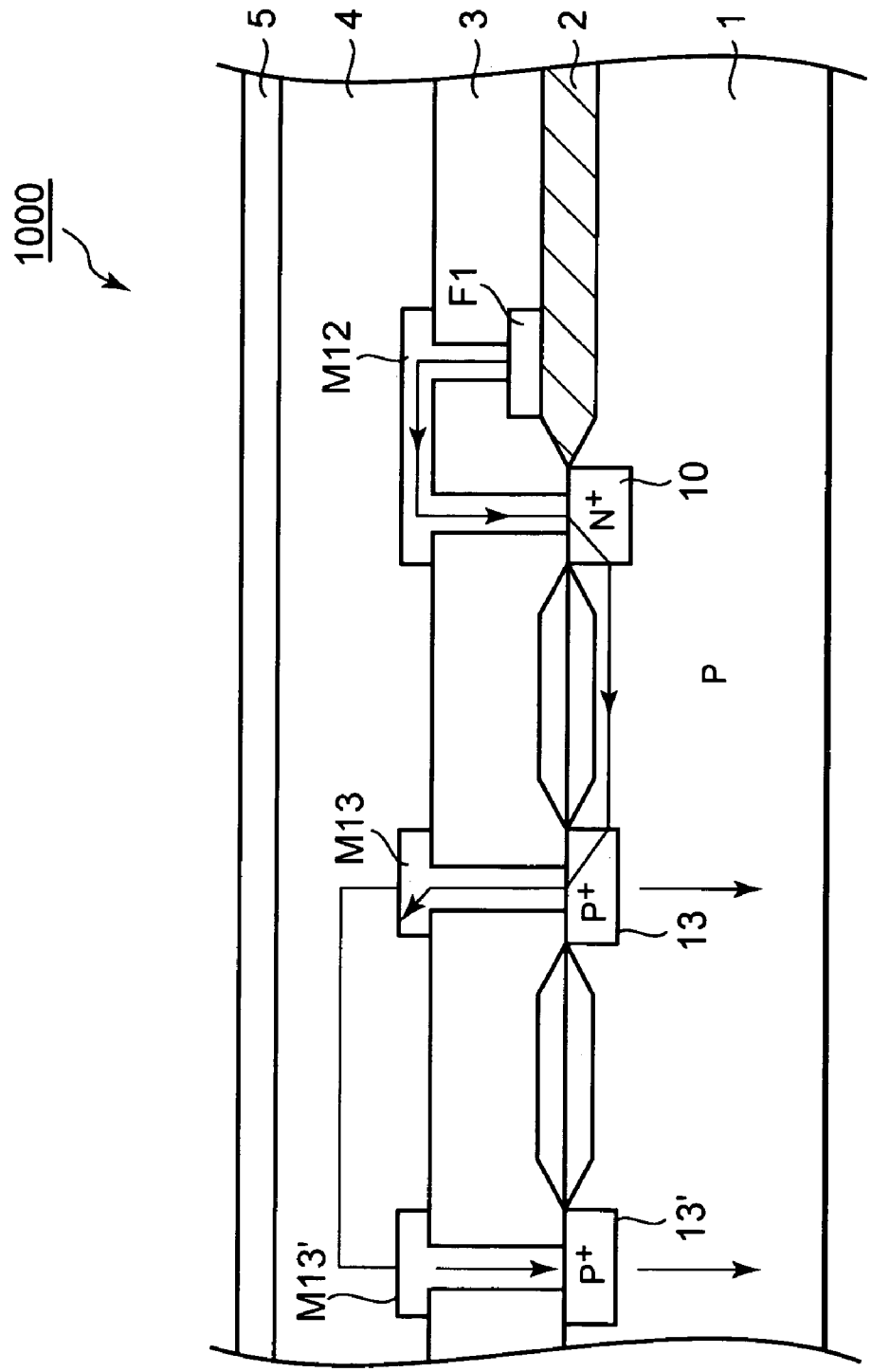
FIG. 4 is a cross-sectional view taken along line IV-IV of FIG. 2.
Figure 5:
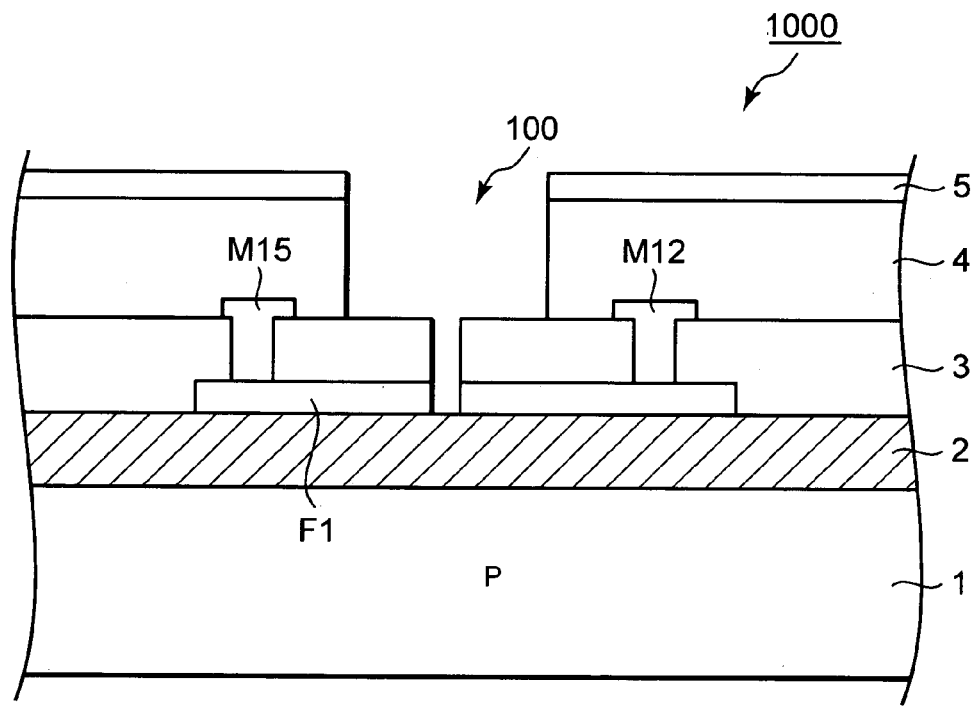
FIG. 5 is a cross-sectional view illustrating a post-cutting state of the redundant fuse.

FIG. 2 is a plan view showing the ESD protection circuits. FIG. 3 is a cross-sectional view taken along line III-III of FIG. 2. FIG. 4 is a cross-sectional view taken along line IV-IV of FIG. 2. FIG. 5 is a cross-sectional view for describing a state in which the redundant fuse has been cut.

As shown in FIGS. 3 and 4, the semiconductor device 1000 is provided with a P-type semiconductor substrate 1 and a field insulating film 2 formed on the surface of the P-type semiconductor substrate 1. The semiconductor substrate 1 is placed on a stage in a state of a wafer and identical in potential to the stage. Although the semiconductor substrate 1 is placed on the stage with a film interposed therebetween in a scribing process to be described later, it is identical in potential to the stage because the film is very thin and the capacitance between the wafer and the stage is very large. Patterning a polysilicon layer formed on the field insulating film 2 forms the fuses F1 through F3. As shown in FIG. 3, the fuse F1 is covered with an insulating film 3 and connected to first layer wirings M12 and M15 through apertures defined in the insulating film 3. The first layer wirings M12 and M15 are covered with an insulating film 4 and a protection film 5. An aperture 100 opened above the fuses F1 through F3 is defined in the insulating film 4 and the protection film 5. When the insulating film 3 and the fuse F1 are cut by laser light through the aperture 100, a cut section of the fuse F1 is exposed to the outside through the aperture 100 as shown in FIG. 5. Although the fuse F1 has been explained in the present embodiment, the fuses F2 and F3 are also similar to above.

As shown in FIG. 2, one end of the fuse F1 is connected to its corresponding resistor R1. Extending the polysilicon layer of the fuse F1 and patterning it thinly as compared with the fuse F1 forms the resistor R1. The resistor R1 is formed in the same layer as the polysilicon layer of the fuse F1. The other end of the resistor R1 is connected to corresponding first layer wiring M10, which is connected to the transistor Tr1. An N+ diffusion layer 10 added with an N type impurity in a high concentration is formed in the neighborhood of the end on the resistor R1 side, of the fuse F1. As shown in FIG. 4, the N+ diffusion layer 10 is formed in a region (active region) free of the field insulating film 2 at the surface of the semiconductor substrate 1. The end on the resistor R1 side, of the fuse F1 and the N+ diffusion layer 10 are electrically connected to the first layer wiring M12 through the aperture defined in the insulating film 3. A P+ diffusion layer 13 added with a P-type impurity in a high concentration is formed in the active region of the surface of the semiconductor substrate 1. The P+ diffusion layer 13 is of a sub contact formed so as to surround the fuses F1 through F3. Even except for the P+ diffusion layer 13, a plurality of sub contacts each formed of a P+ diffusion layer are formed so as to surround the P+ diffusion layer 13. The plurality of sub contacts are electrically connected to one another. As shown in FIG. 4, for example, a P+ diffusion layer 13 closest to the N+ diffusion layer 10 is formed and a P+ diffusion layer 13' is formed so as to surround the P+ diffusion layer 13. As shown in FIG. 4, the P+ diffusion layer 13 and the P+ diffusion layer 13' are electrically connected to each other via first layer wirings M13 and M13'. Although the P+ diffusion layer 13 and the P+ diffusion layer 13' has been shown in the present embodiment, sub contacts each comprised of the P+ diffusion layer 13 may further be provided outside the P+ diffusion layer 13'.

The N⁺ diffusion layer 10, the semiconductor substrate 1 and the P⁺ diffusion layer 13 constitute the diode D1, which discharges an ESD surge generated at the fuse cut section to the substrate potential through a path indicated by arrow in FIG. 4. That is, the ESD surge generated at the fuse F1 is discharged from the P⁺ diffusion layer 13 to the semiconductor substrate 1 and the stage via the N⁺ diffusion layer 10, the semiconductor substrate 1 and the P⁺ diffusion layer 13 or from the P⁺ diffusion layer 13 to the semiconductor substrate 1 and the stage via other sub contact such as the P⁺ diffusion layer 13' in the form of an electrical charge. When the ESD surge generated at the fuse F1 is caused to directly escape from the N⁺ diffusion layer 10 to the semiconductor substrate 1 below the N⁺ diffusion layer 10, it is hard to escape to the substrate potential due to the resistance value of the semiconductor substrate 1. As in the present embodiment, however, paths are formed which disperse the surge into a low resistance layer large in area, comprising the P⁺ diffusion layer 13 and P⁺ diffusion layer 13' surrounding the fuse F1 and which allow the surge to escape from the P⁺ diffusion layer 13 and the P⁺ diffusion layer 13' to the semiconductor substrate 1, thereby making it possible to cause the ESD surge to escape promptly.

One end of the fuse F2 is connected to the gate terminals of the transistors Tr4 and Tr5 of the internal circuit through the resistor R3 and a first layer wiring M11. In a manner similar to the resistor R1, the resistor R3 is also formed by extending the polysilicon layer of the fuse F2 and patterning it thinly as compared with the fuse F2. The end on the resistor R3 side, of the fuse F2 is connected to an N⁺ diffusion layer 11 through a first layer wiring M14 in a configuration similar to the fuse F1 shown in FIG. 4. The N⁺ diffusion layer 11 constitutes the diode D3 together with the P-type semiconductor substrate 1 and the P⁺ diffusion layer 13 and discharges the ESD surge generated at the cut sections of the fuses F2 and F3 to the substrate potential in a manner similar to the fuse F1. Diffusing the electrical charge charged in the fuse F2 or F3 into the P⁺ diffusion layer 13 even here makes it possible to discharge the electrical charge to the substrate potential rapidly. Since other sub contact such as the P⁺ diffusion layer 13' electrically connected to the P⁺ diffusion layer 13 exists outside the P⁺ diffusion layer 13, the ESD surge can be diffused into the corresponding wide conductive layer through the P⁺ diffusion layer 13 so as to be discharged to the substrate potential rapidly.

One end of the fuse F3 is connected to the transistors Tr4 and Tr5 via the resistor R3 and the first layer wiring M11 and electrically connected to the N⁺ diffusion layer 11 through the first layer wiring M14. Accordingly, the ESD surge generated at the cut section of the fuse F3 is also discharged to the substrate potential by the diode D3 comprised of the N⁺ diffusion layer 11, P-type semiconductor substrate 1 and P⁺ diffusion layer 13. That is, the diode D3 comprised of the N⁺ diffusion layer 11, P-type semiconductor substrate 1 and P⁺ diffusion layer 13 is shared for the fuses F2 and F3 as an ESD surge measure against the fuses F2 and F3. Diffusing the electrical charge charged in the fuse F3 into the P⁺ diffusion layer 13 even here makes it possible to discharge the electrical charge to the substrate potential rapidly. Since other sub contact such as the P⁺ diffusion layer 13' electrically connected to the P⁺ diffusion layer 13 exists outside the P⁺ diffusion layer 13, the ESD surge can be diffused into the corresponding wide conductive layer through the P⁺ diffusion layer 13 so as to be discharged to the substrate potential rapidly. Sharing one diode for the two fuses in this way makes it possible to reduce the area necessary to form each of the ESD protection circuits and prevent upsizing of the semiconductor device. Incidentally, the other end of the fuse F3 is grounded to the substrate potential through a first layer wiring M17 and a second layer wiring M20.

The other ends (on the side below the sheet in FIG. 2) of the fuses F1 and F2 are respectively connected to a second layer wiring M21 through the first layer wiring M15 and a first layer wiring M16. The second layer wiring M21 is connected to an N⁺ diffusion layer 12 via a first layer wiring M18. The N⁺ diffusion layer 12 is formed in the active region of the surface of the semiconductor substrate 1 in a manner similar to the N⁺ diffusion layer 10 shown in FIG. 4. The N⁺ diffusion layer 12 constitutes the diode D2 together with the P-type semiconductor substrate 1 and the P⁺ diffusion layer 13. The first layer wiring M18 is further connected to the resistor R2. The resistor R2 is also formed of a polysilicon layer in a manner similar to the resistors R1 and R3. The resistor R2 is connected to the gate terminals of the transistors Tr2 and Tr3 of the internal circuit via a first layer wiring M19. Even though an ESD surge occurs in the cut section of the fuse F1 or F2, an electrical charge intruded from the cut section of the fuse F1 or F2 is discharged to the substrate potential through the N⁺ diffusion layer 12, the P-type semiconductor substrate 1 and the P⁺ diffusion layer 13 (via the diode D2). It is therefore possible to protect the gate insulating film for the transistors Tr2 and Tr3 from the ESD surge. Diffusing the electrical charge charged in the fuse F1 or F2 into the P⁺ diffusion layer 13 even here makes it possible to discharge the electrical charge to the substrate potential rapidly. Since other sub contact such as the P⁺ diffusion layer 13' electrically connected to the P⁺ diffusion layer 13 exists outside the P⁺ diffusion layer 13, the ESD surge can be diffused into the corresponding wide conductive layer through the P⁺ diffusion layer 13 so as to be discharged to the substrate potential promptly.

According to the ESD protection circuits according to the present embodiment described above, even if a fuse cut section is exposed to the outside in a scribing process executed during from after fuse cutting and processing to resin encapsulation, transistors in an internal circuit can be protected from an ESD surge generated at the fuse cut section. Described specifically, there is a high possibility that water used in the scribing process will be electrostatically charged. However, even though the ESD surge occurs in the fuse cut section due to the charged water, the transistors of the internal circuit can be protected owing to the discharge of an electrical charge to a substrate potential (stage) via the fuse cut section, N⁺ diffusion layer, P-type semiconductor substrate and P⁺ diffusion layer. Even if an ESD surge is generated at a fuse cut section from a charged film upon picking each individualized chip for a semiconductor device, which has been placed on a film, after the scribing process, an electrical charge is discharged to the substrate potential (stage) via the N⁺ diffusion layer, semiconductor substrate and P⁺ diffusion layer. Since the resistor is connected between the fuse and each of the transistors of the internal circuit, the transfer of an electrical charge from the fuse to its corresponding transistor can be suppressed. As a result, the transistors of the internal circuit can effectively be protected from the ESD surge generated at the fuse cut section.

In the present embodiment, the P⁺ diffusion layer is formed in the surface of the P-type semiconductor substrate located in the vicinity of the N⁺ diffusion layer. Therefore, an electrical charge charged in each fuse is diffused into the substrate potential via the N⁺ diffusion layer and the P⁺ diffusion layer from the surface of the P-type semiconductor substrate. Since the P+ diffusion layer is formed so as to surround the fuses at this time, the electrical charge is diffused into the P+ diffusion layer wide in area so that it can promptly be discharged to the substrate potential. If the P+ diffusion layer is formed double or more, then the electrical charge charged in the corresponding fuse can be diffused over a wider area and discharged more promptly.

In the present embodiment as well, the diode is shared for a plurality of fuses where the plurality of fuses are connected to the same transistors. Therefore, the N+ diffusion layer constituting the diode can be used in common, and the area necessary to form each of the ESD protection circuits can be reduced.

Figure 9:
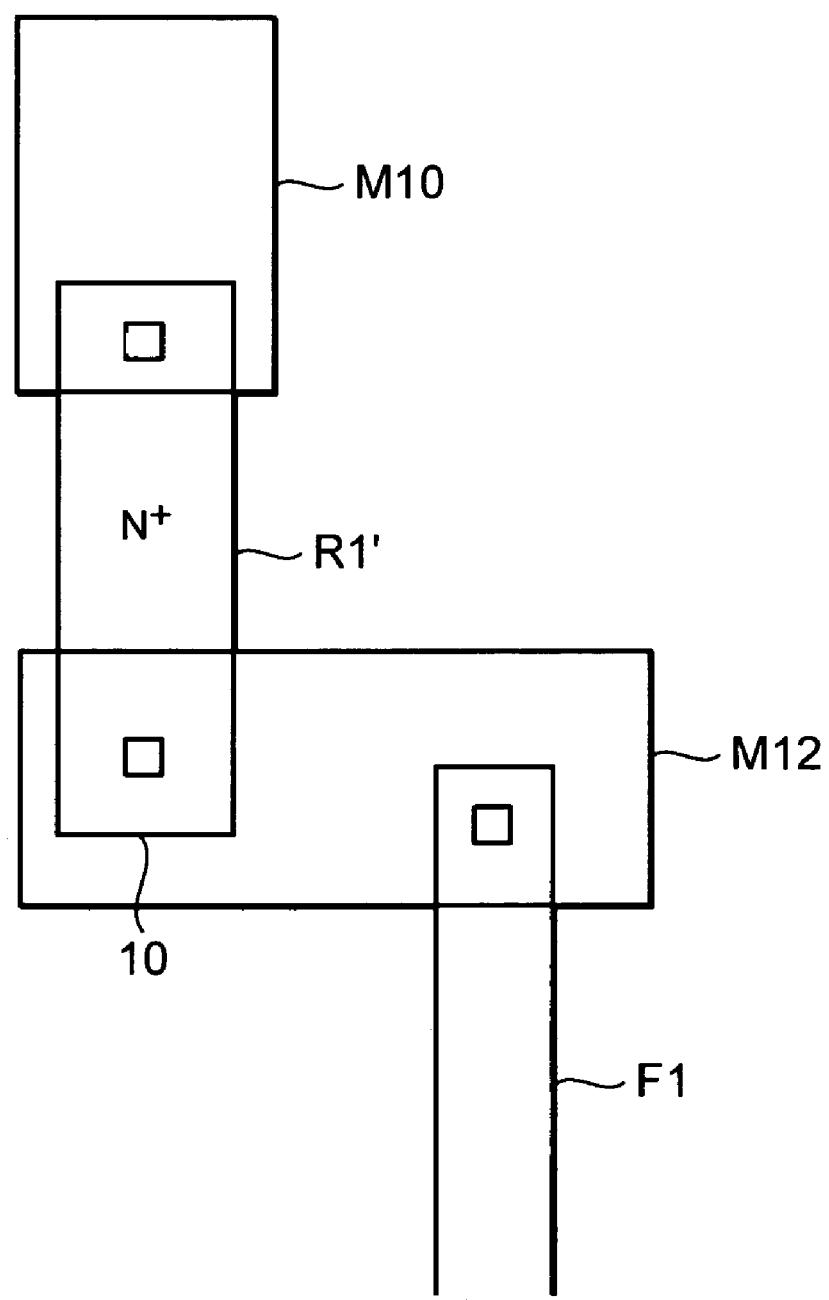
FIG. 9 is an example illustrative of a modification of a resistor of the ESD protection circuit.

Incidentally, although the resistor of each ESD protection circuit is being formed of the polysilicon layer in the present embodiment, the resistor may be formed using an N+ diffusion layer by extending the N+ diffusion layer as shown in FIG. 9. The example of FIG. 9 shows a case in which a resistor R1' is formed using an N+ diffusion layer 10. With the formation of the resistor R1' by use of the N+ diffusion layer 10, the area necessary to form the ESD protection circuit can be reduced.

As an alternative to the formation of the resistor by use of the polysilicon layer and the N+ diffusion layer, the fuses F1 through F3 may be constituted of resistive bodies or elements and used as resistors. Since the fuses F1 through F3 per se are used as the resistors in this case, the area necessary to form each of the ESD protection circuits can be further reduced.

Incidentally, although the laser fuses have been explained above by way of example, the present invention is applicable even to other fuses such as an electric fuse, etc.

Second Preferred Embodiment

Figure 6:
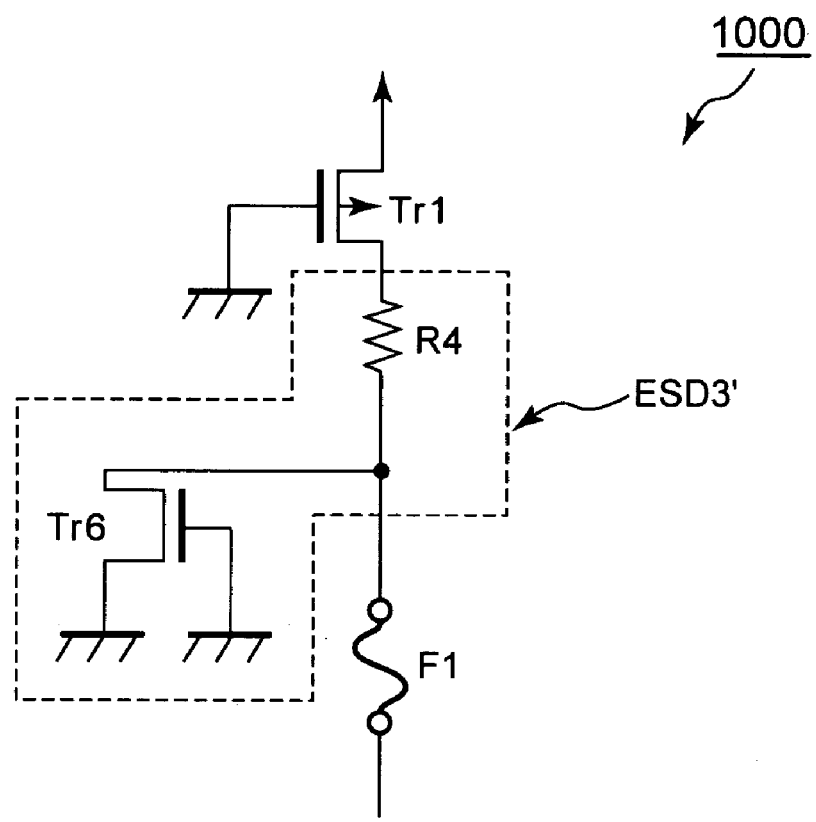
FIG. 6 is an electric circuit diagram showing an ESD protection circuit provided in the neighborhood of a redundant fuse of a semiconductor device according to a second embodiment.

FIG. 6 is a diagram for describing an electric circuit for an ESD protection circuit provided in the neighborhood of a redundant fuse of a semiconductor device according to a second embodiment of the present invention.

In the present embodiment, the diode of the ESD protection circuit is substituted with an N-type transistor and the polysilicon resistor is substituted with a metal resistor. An electric circuit in which the ESD protection circuit ESD3 shown in FIG. 1 is substituted with an ESD3' according to the present embodiment, will be explained by way of example in the present embodiment. The ESD3' comprises an N-type transistor Tr6 with which the diode D3 is substituted, and a metal resistor R4 with which the resistor R3 is substituted. A drain terminal of the transistor Tr6 is connected to a fuse F1, and source and gate terminals thereof are connected to a substrate potential via a P+ diffusion layer 13. The resistor R4 is a metal resistor formed of a metal oxide film or the like and connected to the fuse F1 and a drain terminal of a transistor Tr1. Since the ESD surge generated at the cut section of the fuse F2 or F3 is discharged from the transistor Tr6 to the substrate potential (stage) via the P+ diffusion layer 13, and the resistor R4 prevents the ESD surge from being transferred to a source terminal of the transistor Tr1, the transistor Tr1 is protected. Diffusing an electrical charge charged in the fuse F2 or F3 into the P+ diffusion layer 13 even here makes it possible to discharge the electrical charge to the substrate potential rapidly. Since other sub contact such as a P+ diffusion layer 13' electrically connected to the P+ diffusion layer 13 exists outside the P+ diffusion layer 13, the ESD surge can be diffused into the corresponding wide conductive layer through the P+ diffusion layer 13 so as to be discharged to the substrate potential promptly.

Figure 7:
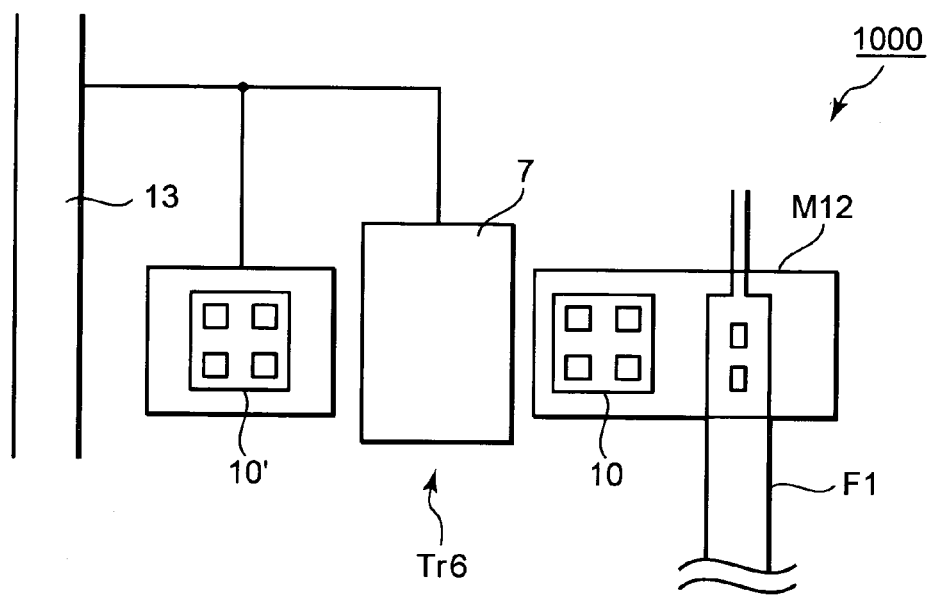
FIG. 7 is a plan view illustrating the ESD protection circuit according to the second embodiment.
Figure 8:
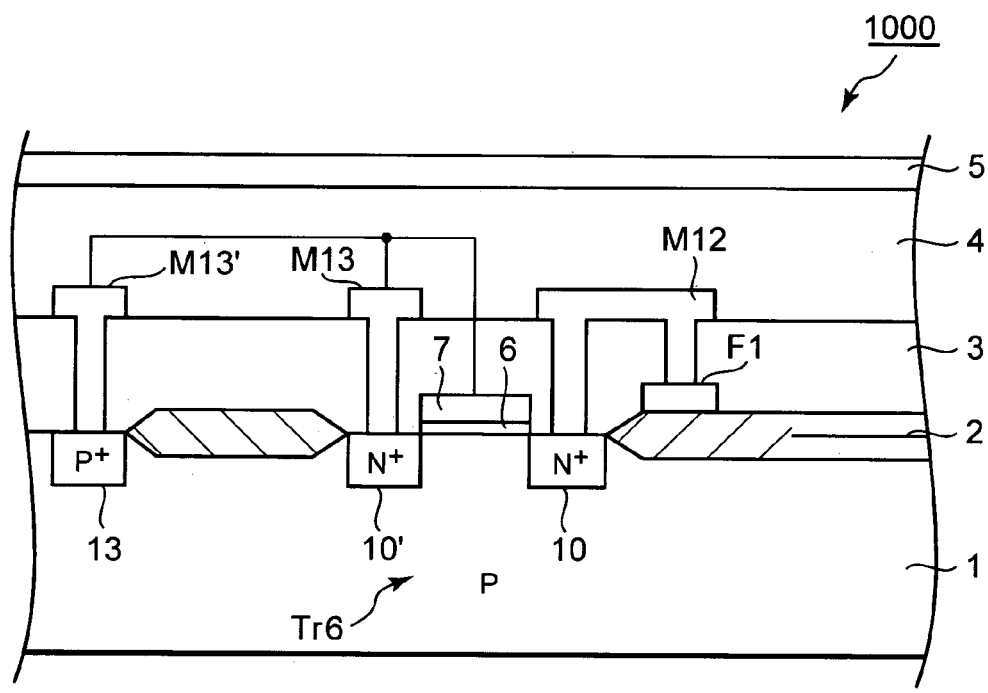
FIG. 8 is a cross-sectional view taken along line VIII-VIII of FIG. 7.

FIG. 7 is a plan view of the ESD protection circuit shown in FIG. 6, and FIG. 8 is a cross-sectional view of the ESD protection circuit shown in FIG. 6, respectively. Components similar to the first embodiment are given like or corresponding reference numerals and their description will therefore be omitted.

As shown in FIGS. 7 and 8, the transistor Tr6 is provided with N+ diffusion layers 10 and 10' formed in the surface of a semiconductor substrate 1, a gate insulating film 6 and a gate electrode 7. The N+ diffusion layer 10' is grounded to the substrate potential via other sub contacts such as the P+ diffusion layer 13 and the P+ diffusion layer 13'. The N+ diffusion layer 10 is connected to one end of the fuse F1 by a first layer wiring M12.

In the transistor Tr6 shown in FIGS. 7 and 8, a breakdown occurs between the reverse-biased N+ diffusion layer 10 and the P-type semiconductor substrate 1 when the voltage applied to the N+ diffusion layer 10 rises due to the electrical charge charged in the fuse F2 or F3. Consequently, a breakdown current flows from the N+ diffusion layer 10 to the P-type semiconductor substrate 1 and thereby flows into the N+ diffusion layer 10'. The breakdown current results in a base current for the bipolar transistor comprised of the N+ diffusion layer 10, P-type semiconductor substrate 1 and N+ diffusion layer 10', whereby the N+ diffusion layer 10, the P-type semiconductor substrate 1 and the N+ diffusion layer 10' operate as the bipolar transistor. Thus, the ESD surge can promptly be discharged from the P+ diffusion layer 13 to the substrate potential through the N+ diffusion layer 10, the P-type semiconductor substrate 1 and the N+ diffusion layer 10'. That is, the ESD surge can be discharged rapidly using the snapback breakdown of the transistor Tr6. Diffusing the electrical charge charged in the fuse F2 or F3 into the P+ diffusion layer 13 enables prompt discharge of the electrical charge to the substrate potential. Since other sub contact such as the P+ diffusion layer 13' electrically connected to the P+ diffusion layer 13 exists outside the P+ diffusion layer 13, the ESD surge can be diffused into the corresponding wide conductive layer through the P+ diffusion layer 13 so as to be discharged to the substrate potential promptly.

What is claimed is:

1. A semiconductor device comprising:
   a semiconductor substrate having a first conductivity type and a surface thereof;
   an insulating layer selectively formed on the surface of the semiconductor substrate;
   a fuse formed on the insulating layer, the fuse having a first terminal and a second terminal;
   a first diffusion layer having a second conductivity type formed on the surface of the semiconductor substrate, the first diffusion layer being electrically connected to the first terminal of the fuse;
   a first resistor having a first end and a second end, the first end of the first resistor being connected to the first terminal of the fuse;
   a gate of a first transistor connected to the second end of the first resistor;
   a second resistor having a first end and a second end, the first end of the second resistor being connected to the second terminal of the fuse; and
   a second transistor connected to the second end of the second resistor,
   wherein the first transistor, the first resistor, the fuse, the second resistor, and the second transistor are electrically connected together in this order before the fuse is blown, and the first transistor is electrically disconnected from the second transistor after the fuse is blown, and wherein the first resistor is formed of a second diffusion layer formed on the surface of the semiconductor substrate.

2. A semiconductor device according to claim 1, further comprising,
a third diffusion layer having the second conductivity type formed on the surface of the semiconductor substrate, the third diffusion layer being electrically connected to the second terminal of the fuse.

3. A semiconductor device according to claim 1, wherein the fuse is formed of polysilicon.

4. A semiconductor device according to claim 1, wherein the fuse and the first diffusion layer are surrounded by a third diffusion layer having the first conductivity type and being connected to the ground.

5. A semiconductor device according to claim 1, further comprising:
a first wiring having a first end and a second end, the first end of the first wiring being physically connected to the second end of the first resistor; and
a second wiring having a first end and a second end, the first end of the second wiring being physically connected to the second end of the second resistor, and
wherein the first transistor is physically connected to the second end of the first wiring, and the second transistor is physically connected to the second end of the second wiring.

* * * * *